United States Patent [19]

Hatada

[11] Patent Number: 4,693,770
[45] Date of Patent: Sep. 15, 1987

[54] METHOD OF BONDING SEMICONDUCTOR DEVICES TOGETHER

[75] Inventor: Kenzo Hatada, Katano, Japan

[73] Assignee: Matsushita Electric Industrial Co., Ltd., Osaka, Japan

[21] Appl. No.: 877,967

[22] Filed: Jun. 24, 1986

[30] Foreign Application Priority Data

Jul. 5, 1985 [JP] Japan ................................ 60-148908

[51] Int. Cl.[4] ............................................... C25D 5/48
[52] U.S. Cl. ...................................... 156/151; 29/840; 228/180.2; 228/188
[58] Field of Search .......................... 29/829, 830, 840; 56/150, 151; 228/180.2, 188

[56] References Cited

U.S. PATENT DOCUMENTS

| 4,032,058 | 6/1977 | Riseman | 228/188 X |
| 4,273,859 | 6/1981 | Mones et al. | 228/180.2 X |
| 4,396,140 | 8/1983 | Jaffe et al. | 228/180.2 X |
| 4,494,688 | 1/1985 | Hatada et al. | 228/180.2 |
| 4,585,157 | 4/1986 | Belcher | 228/180.2 |

Primary Examiner—Robert A. Dawson
Attorney, Agent, or Firm—Wenderoth, Lind & Ponack

[57] ABSTRACT

Disclosed is a method of realizing high-density and inexpensive semiconductor apparatus by joining the electrodes of two semiconductor devices. A metal bump formed on a substrate is transferred and joined onto the electrode of first semiconductor device, and electrode of second semiconductor device and the metal bump transferred and joined on the first semiconductor device are positioned, pressed and heated, thereby joining the two semiconductor devices together.

16 Claims, 4 Drawing Figures

METHOD OF BONDING SEMICONDUCTOR DEVICES TOGETHER

BACKGROUND OF THE INVENTION

This invention relates to a method of fabricating a semiconductor device or the like in a high density, thin, and small package.

Semiconductor devices such as IC and LSI are recently used in various electric household appliances and industrial machines. These electric household appliances and industrial machines are promoted in the tendency of being smaller and thinner, or being portable, in order to save resources, save energy or extend the range of applications.

To cope with this portable trend, for semiconductor devices, smaller and thinner packaging is being required. Silicon slices after diffusion process and electrode wiring process are cut into chips in the unit of semiconductor devices, and electrode leads are taken out from the aluminum electrode terminals provided around the chip to the external terminals for the ease of handling, and the chips are packaged to be protected mechanically. Usually, for packaging of these semiconductor devices, DIL, chip carrier, flip chip, tape carrier and other methods are employed, and, for example, the DIL and chip carrier are intended to connect from the electrode terminals of semiconductor device to external terminals one by one sequentially by using ultrathin wires of Au or Al in 25 to 35 $\mu$m in diameter. Accordingly, as the number of electrode terminals on the semiconductor device increases, the reliability of connecting positions is lowered, and also the number of external terminals increases as a result at constant intervals, which results in increase of the packaging size.

In the LSI such as I/O connected with the LSI for memory or microcomputer, as the number of functions increases, the number of electrode terminals extremely increases to 60 or even 100 terminals, and the packaging size becomes as large as tens of cubic centimeters for handling a tiny semiconductor device of only tens of cubic millimeters. This was the bottleneck for promotion of downsizing of appliances.

The following methods are known, for example, as the manner of mounting these semiconductor devices at high density, in small size, and in small thickness. In a first method, a semiconductor device is fixed on a wiring substrate having a wiring pattern, and the aluminum electrodes of semiconductor device and wiring pattern are connected by using ultrathin wires of Au or Al. That is, this is a method of mounting a semiconductor device flatly and connecting it with wires, in which the wires stand higher than the semiconductor device and it is difficult to mount thinly, and a region including electrodes of semiconductor device and wiring pattern is needed for connection, and the flat mounting area increases, making it difficult to reduce the size.

In a second method, a metal bump is formed on the aluminum electrode of semiconductor device, and a film lead is joined to it, and the wiring pattern of wiring substrate and said film lead are connected. This method, in order to form a metal bump on the semiconductor device, requires vacuum deposition process, photolithography process, etching process, and plating process, and it not only lowers the yield of semiconductor devices but also raises the packaging cost. Again, same as in the first method, since a region for joining the film lead with the wiring pattern is needed, the flat mounting surface increases, and it is hard to reduce the size.

SUMMARY OF THE INVENTION

It is, accordingly, primary object of this invention to provide method of fabricating a semiconductor device which can solve the above-stated problems of the related method.

Another object of this invention is to provide method of fabricating a semiconductor device by which two semiconductor devices are readily joined to each other at low cost so that integration degree of semiconductor device is highly improved.

These and other objects of this invention are accomplished by a method of fabricating a semiconductor device which comprises the steps of conducting alignment of a metal bump and an electrode of a first semiconductor device, the metal bump being formed on a substrate, pressing the electrode of the first semiconductor device to said metal bump on the substrate and removing the metal bump from the substrate so that the metal bump is joined to the electrode of the first semiconductor device, conducting alignment of the metal bump joined to the first semiconductor device and an electrode of a second semiconductor device, and pressing the metal bump to the electrode of the second semiconductor device so that the electrodes of the first and second semiconductor devices are joined together.

In a specific embodiment, the metal bump is made of Au, Al, Ni, Ag or solder. The electrode is formed on a surface area of the semiconductor device.

The resin layer may be formed on the electrode of said first semiconductor device. The resin layer has function as adhesive. The resin layer may be formed on said metal bump to be joined to the electrode of said first semiconductor device. The substrate has an opening at a position corresponding to the electrode of the semiconductor device and said bump is formed at the opening by electroplating.

According to the present invention as described herein, the following benefits, among others, are obtained.

(1) Electrodes of a semiconductor device can be joined together easily without any particular treatment, and in a certain condition, the bond strength per bump was more than 15 g, and an excellent strength was obtained. Thus, inexpensive, highly reliable, thin, small semiconductor devices can be fabricated. Besides, the construction of this invention is a laminar structure and a connection area with external circuit is not needed, so that the flat mounting area can be reduced.

(2) Since semiconductor devices differing in function may be easily joined closely, a device having a new function and higher added value can be formed.

(3) The number of contact points is extremely small and connections are extremely short, so that a high reliability is obtained while the material cost is lowered.

While the novel features of the invention are set forth with particularly in the appended claims, the invention, both as to organization and content, will be better understood and appreciated, along with other objects and features thereof, from the following detailed description taken in conjunction with the drawing, in which:

DETAILED DESCRIPTION OF THE INVENTION

Figure 1:
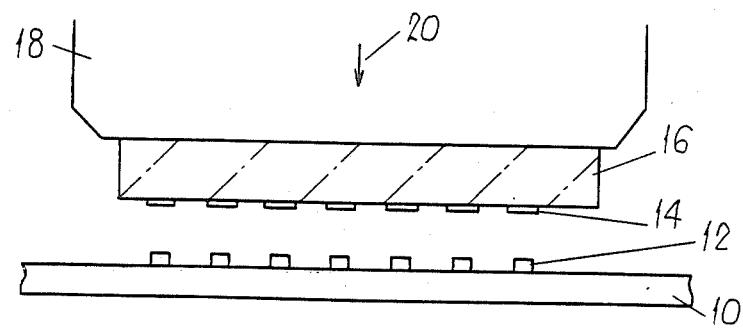
FIG. 1 through FIG. 3 are sectional process drawings to explain the method of fabricating a semiconductor device according to one of the embodiments of this invention.
Figure 2:
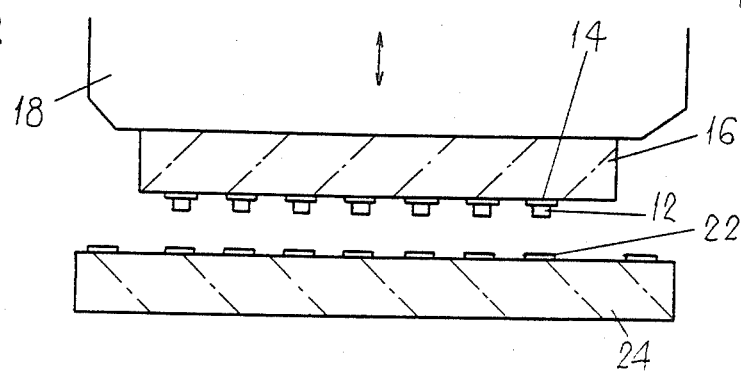
Figure 3:
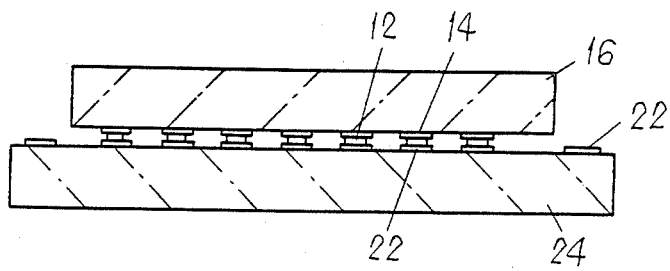

The method of fabricating a semiconductor device according to one of the embodiments of this invention is described while referring to FIG. 1 to FIG. 3. Au bumps 12 formed on a substrate 10 and a semiconductor device (e.g. IC) 16 having Al electrodes 14 at the opposite positions thereof are positioned together and are pressed and heated in the arrow 20 direction by means of a tool 18 (FIG. 1). When pressing and heating in the arrow 20 direction are eliminated, the Au bumps 12 on the substrate are transferred and joined on the Al electrodes of the semiconductor device 16. Here, the Au bumps 12 and Al electrodes 14 are joined with a slight amount of Au-Al alloy. Next, a second semiconductor device (e.g. IC) 24 having Al electrodes 22 at positions opposing to the Al electrodes 14 on said semiconductor device 16 and the Au bumps 12 on the Al electrodes 14 of said first semiconductor device 16 are positioned together (FIG. 2), and are pressed and heated in the arrow 20 direction by using the tool 18. As a result, as shown in FIG. 3, the Al electrodes 14 of the first semiconductor device 16 and the Al electrodes 22 of the second semiconductor device 24 are mutually joined at the Au bumps 12 through the Au-Al alloy. The Al electrodes of the second semiconductor device 24 are the electrodes for connecting with an external circuit. In the state shown in FIG. 3, the Au bumps 12 intervening between the Al electrodes 14 of the first semiconductor device 16 and the Al electrodes 22 of the second semiconductor device 24 are pressed and spread widely by pressing and heating. In this spreading process, the oxide layer existing on the surface of Al electrodes of the semiconductor devices is removed, and a fresh Al electrode surface is exposed, and it is alloyed with the Au bumps to form an Au-Al alloy, which achieves junction. Incidentally, the state shown in FIG. 2, that is, the Au-Al alloy forming state when the Au bumps 12 are transferred and joined on the Al electrodes 14 on the first semiconductor device 16 may be smaller at least than the final state shown in FIG. 3.

Therefore, when transferring and bonding Au bumps 12 on the Al electrodes 14 of the first semiconductor device 16, an alloy of Au and Al may be formed, or it may be also possible to transfer and bond by mere pressing or by slight heating by applying and forming an adhesive resin layer on the surface of the Al electrodes 14 or Au bumps 12. that is, a state of provisional bond is formed.

Figure 4:
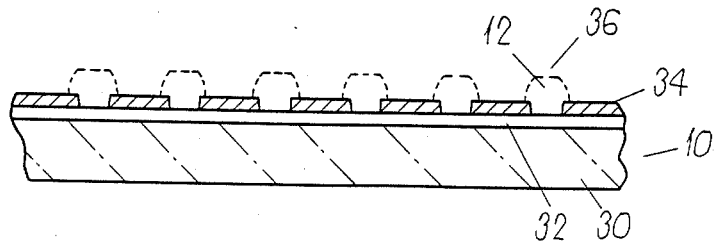
FIG. 4 is a sectional view showing a substrate for forming a metal bump used in the same method.

Incidentally, the substrate 10 on which Au bumps 12 are formed is constructed, for example, as shown in FIG. 4 by forming a conductive film 32 such as Pt and TIO film on an insulating substrate 30 such as heat resistant glass and ceramics, disposing a heat resistant film 34 such as $siO_2$, $Si_3N_4$ and polyimide resin on it, and opening holes 36 at specified positions opposing to the electrodes of the semiconductor device. The Au bumps 12 are formed in a thickness of 5 to 40 $\mu$m by electroplating method using the conductive film 32 as one of the electrodes, and the material of the bumps 12 may be anything which may at least easily form an alloy with the electrode material of the semiconductor device or may be press-fitted easily, and for example, Cu, Ag, solder, Ni, and Al may be used.

Here, the TIO film or Pt film, used as the conductive film 32, was extremely easy to form plating and was excellent in releasing property of Au bumps. Furthermore, the semiconductor devices 16, 24 may be semiconductor substrates, such as Si, GaAs, InP substrates, or may be circuit substrates having resistors and capacitors. The electrodes 14, 22 are generally made of Al, but Cu, Au, Ni or the like may be also used. When the semiconductor devices 16, 24 are Si substrates, and the electrodes 14, 22 are Al, and the bumps 12 are Au, the junction of electrodes 14, 22 of the semiconductor devices 16, 24 is composed Au-Al alloy.

Meanwhile, the electrodes 14, 22 of the semiconductor devices 16, 24 may be formed either on the entire surface of the semiconductor devices, or on the marginal area, and their flat surface area may be 5 by 5 $\mu m^2$ or larger for the ease of forming. To join securely, it is at least necessary to flatten the surface of the semiconductor devices.

In FIG. 1, the condition of transferring and joining Au bumps 12 on the electrodes 14 of semiconductor device 16 is 250° to 450° C., and when the flat area of Au bumps 12 is 20 by 20 $\mu m^2$, pressure on each bump is 10 to 70 g. In FIG. 3, the joining condition of the electrodes is 350° to 500° C., and pressure on each bump is 50 to 200 g.

In this construction, when the semiconductor device is a memory device, a double capacity may be easily obtained in a same flat area, and when one of the semiconductor devices is a chip of laser or LED made of InP or GaAs, and the other one is a drive circuit of said chip made of Si substrate, dissimilar materials and functions of the chip and drive circuit may be integrated, and the wiring resistance and connection loss may be prevented.

Or as shown in the drive circuit of EL or liquid crystal display, it is possible to produce at higher yield and at lower cost by manufacturing the device of high withstand voltage and the circuit to drive it separately, and joining them later in the method described in FIG. 1.

While specific embodiments of the invention have been illustrated and described herein, it is realized that other modifications and changes will occur to those skilled in the art. It is therefore to be understood that the appended claims are intended to cover all modifications and changes as fall within the true spirit and scope of the invention.

What we claim is:

1. A method of fabricating a semiconductor device comprising the steps of:

conducting alignment of a metal bump and an electrode of a first semiconductor device, said metal bump being formed on a substrate;

pressing the electrode of the first semiconductor device to said metal bump on the substrate and removing the metal bump from said substrate so that said metal bump is joined to said electrode of the first semiconductor device;

conducting alignment of the metal bump joined to the first semiconductor device and an electrode of a second semiconductor device; and pressing the metal bump to the electrode of the second semiconductor device so that the electrodes of said first and second semiconductor devices are joined together.

2. The method of fabricating a semiconductor device of claim 1, wherein said metal bump is made of Au, Al, Ni, Ag or solder.

3. The method of fabricating a semiconductor device of claim 1, wherein said electrode is formed on a surface area of the semiconductor device.

4. The method of fabricating a semiconductor device of claim 1, wherein resin layer is formed on said electrode of said first semiconductor device.

5. The method of fabricating a semiconductor device of claim 4, wherein said resin layer has function as adhesive.

6. The method of fabricating a semiconductor device of claim 1, wherein resin layer is formed on said metal bump to be joined to the electrode of said first semiconductor device.

7. The method of fabricating a semiconductor device of claim 6, wherein said resin layer has function as adhesive.

8. The method of fabricating a semiconductor device of claim 1, wherein said substrate has an opening at a position corresponding to the electrode of the semiconductor device and said bump is formed at the opening by electro-plating.

9. A method of fabricating a semiconductor device comprising the steps of:

forming a metal bump by electro-plating an opening formed on a substrate which has said opening at a position corresponding to an electrode of a first semiconductor device;

conducting alignment of a metal bump and an electrode of a first semiconductor device, said metal bump being formed on a substrate;

pressing the electrode of the first semiconductor device to said metal bump on the substrate and removing the metal bump from said substrate so that said metal bump is joined to said electrode of the first semiconductor device;

conducting alignment of the metal bump joined to the first semiconductor device and an electrode of a second semiconductor device;

pressing the metal bump to the electrode of the second semiconductor device so that the electrodes of said first and second semiconductor devices are joined together; and forming new bump by electro-plating the opening of the substrate.

10. The method of fabricating a semiconductor device of claim 9, wherein said substrate includes an insulating substrate, a conductive film formed on said substrate, and a heat resistant film formed on said film and having said opening.

11. The method of fabricating a semiconductor device of claim 10, wherein said conductive film is either ITO film or Pt film.

12. A method of fabricating a semiconductor device comprising the steps of:

transferring and joining a metal bump formed on a substrate onto an electrode of a semiconductor device; and pressing and heating by positioning an electrode of a second semiconductor device haivng an electrode opposing to the electrode of said first semiconductor device with the metal bump transferred and joined on the electrodes of said first semiconductor device, whereby the electrode of the first semiconductor device and the electrode of the second semiconductor device are joined by way of said metal bump.

13. The method of fabricating a semiconductor device of claim 12, wherein same metal bump is made of Au, Al, Ni, Ag or solder.

14. The method of fabricating a semiconductor device of claim 12, wherein the electrode of said first semiconductor device is formed on the surface region of said semiconductor device.

15. The method of fabricating a semiconductor device of claim 12, wherein a resin layer is formed on the electrode of said first semiconductor device.

16. The method of fabricating a semiconductor device of claim 12, wherein a resin layer is formed on said metal bump.

* * * * *